(12) United States Patent
Lee

(10) Patent No.: US 8,067,956 B2
(45) Date of Patent: Nov. 29, 2011

(54) APPARATUS AND METHOD FOR CALIBRATING ON-DIE TERMINATION IN SEMICONDUCTOR MEMORY DEVICE

(75) Inventor: Dong Uk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 42 days.

(21) Appl. No.: 12/013,804

(22) Filed: Jan. 14, 2008

(65) Prior Publication Data
US 2008/0253201 A1 Oct. 16, 2008

(30) Foreign Application Priority Data

Apr. 12, 2007 (KR) ................ 10-2007-0035858

(51) Int. Cl.
*H03K 17/16* (2006.01)
(52) U.S. Cl. ........................................................ 326/30
(58) Field of Classification Search ............... 326/30
See application file for complete search history.

(56) References Cited

U.S. PATENT DOCUMENTS

| 7,019,555 B2 | 3/2006 | Lee |
| 7,034,567 B2 | 4/2006 | Jang |
| 7,057,415 B2 * | 6/2006 | Allen et al. ............... 326/82 |
| 7,064,989 B2 | 6/2006 | Na et al. |
| 7,151,390 B2 | 12/2006 | Nguyen et al. |
| 7,151,700 B2 | 12/2006 | Ba |
| 2002/0050838 A1 * | 5/2002 | Kim et al. ............... 326/30 |
| 2006/0006903 A1 * | 1/2006 | Choi et al. ............... 326/30 |
| 2006/0226868 A1 | 10/2006 | Lee et al. |

FOREIGN PATENT DOCUMENTS

| JP | 2004-310981 | 11/2004 |
| JP | 2005-228458 | 8/2005 |
| JP | 2006-129423 | 5/2006 |
| KR | 1020020037605 A | 5/2002 |
| KR | 1020060000300 A | 1/2006 |

* cited by examiner

*Primary Examiner* — Shawki S Ismail
*Assistant Examiner* — Thienvu Tran
(74) *Attorney, Agent, or Firm* — Baker & McKenzie LLP

(57) ABSTRACT

An on-die termination circuit in a semiconductor memory apparatus can comprise a comparing block for comparing a reference voltage with a code voltage corresponding to a code and outputting a comparison signal, a counting block for changing the code based on the comparison signal, and controlling block for controlling the counting block based on a match result of previous and current values of the comparison signal.

8 Claims, 8 Drawing Sheets

US 8,067,956 B2

APPARATUS AND METHOD FOR CALIBRATING ON-DIE TERMINATION IN SEMICONDUCTOR MEMORY DEVICE

CROSS-REFERENCES TO RELATED APPLICATION

The present application claims the benefit under 35 U.S.C. 119(a) of Korean application number 10-2007-0035858, filed on Apr. 12, 2007, in the Korean Patent Office, which is incorporated by reference in its entirety as if set forth in full.

BACKGROUND

1. Technical Field

The disclosures herein relate to a semiconductor memory apparatus and, more particularly, to an on-die termination circuit in a semiconductor memory apparatus.

2. Related Art

Generally, when one bus line having a first impedance meets with another bus line having a second impedance different from the first impedance, a signal loss occurs due to the impedance mismatch. An impedance matching operation can be performed to prevent the signal loss. Such an impedance matching operation is called "On-Die Termination."

As shown in FIG. 1, a conventional on-die termination circuit in a semiconductor memory apparatus includes a first D/A converter 10, a first comparator 20, a first counter 30, a second D/A converter 40, a second comparator 50, a second counter 60, a pulse generator 70, a first register 80 and a second resistor 90.

The first D/A converter 10 outputs a first voltage VCOMP_P, which corresponds to a first code (PCODE<0:4>), in response to an enable signal (EN). The first comparator 20 compares the first voltage VCOMP_P with a reference voltage VREF in response to a first pulse (CPOUTP<0:1>) and then outputs a first comparison result signal (COMP_OUTP). The level of the reference voltage VREF can be VDDQ/2. VDDQ is an external power source used for data I/O. The first counter 30 up or down counts the first code (PCODE<0:4>) according to a first count pulse (CNT_PULSEP) so as to correspond to the first comparison result signal (COMP_OUTP). The first register 80 stores the first code (PCODE<0:4>) in response to a code storage pulse (2nd_COMP). The second D/A converter 40 outputs a second voltage VCOMP_N, which corresponds to a second code (NCODE<0:4>), in response to the enable signal (EN).

The second comparator 50 compares the second voltage VCOMP_N with the reference voltage VREF in response to a second pulse (CPOUTN<0:1>) to output a second comparison result signal (COMP-OUTN). In similar to the first counter 30, the second counter 60 also up or down counts the second code (NCODE<0:4>) according to a second count pulse (CNT_PULSEN), so as to correspond to the second comparison result signal (COMP-OUTN). The second register 90 stores the second code (NCODE<0:4>) in response to the code storage pulse (2nd_COMP). The pulse generator 70 generates the first pulse (CPOUTP<0:1>), the second pulse (CPOUTN<0:1>), the first count pulse (CNT_PULSEP), the second count pulse (CNT_PULSEN) and the code storage pulse (2nd_COMP) in response to the enable signal (EN).

The operation of a conventional on-die termination circuit will be described below referring to FIGS. 1 and 2. First, the pulse generator 70 generates the first pulse (CPOUTP<0>) and the second pulse (CPOUTN<0>) after a predetermined time of t1 from the activation of the enable signal (EN).

Then, the first comparator 20 compares the first voltage VCOMP_P with the reference voltage VREF in response to the first pulse (CPOUTP<0>), and the second comparator 50 compares the second voltage VCOMP_N with the reference voltage VREF in response to the second pulse (CPOUTN<0>).

After a predetermined time of t1+t2, the pulse generator 70 generates the first pulse (CPOUTP<1>) and the second pulse (CPOUTN<1>).

The first comparator 20 outputs the first comparison result signal (COMP_OUTP) in response to the first pulse (CPOUTP<1>), and the second comparator 50 outputs the second comparison result signal (COMP-OUTN) in response to the second pulse (CPOUTN<1>). After a predetermined time of t1+t2+t3, the pulse generator 70 generates the first count pulse (CNT_PULSEP) and the second count pulse (CNT_PULSEN).

The first counter 30 counts the first code (PCODE<0:4>) up or down, using first count pulse (CNT_PULSEP) in response to the first comparison result signal (COMP_OUTP). The second counter 60 also counts the second code (NCODE<0:4>) up or down, using the second count pulse (CNT_PULSEN) in response to the second comparison result signal (COMP-OUTN). The pulse generator 70 generates the code storage pulse (2nd_COMP) at the start of the second code counting operation and the code storage pulse (2nd_COMP) is deactivated at the termination of the second code counting operation.

The first register 80 stores the first code (PCODE<0:4>) outputted from the first counter 30 and the second register 90 stores the second code (NCODE<0:4>) outputted from the second counter 60 according to the deactivation of the code storage pulse (2nd_COMP). Thus, the on-die termination operation has been finished.

However, as shown in FIG. 3, in the conventional on-die termination circuit, since there exists an offset voltage VOS in the first comparator 20 and the second comparator 50, the level of the reference voltage VREF can be VDDQ/2±VOS. Thus, the first comparison result signal (COMP_OUTP) or the second comparison result signal (COMP_OUTN) can be changed in a high or low level according to the level change of the reference voltage VREF. That is, the first comparison result signal (COMP_OUTP) or the second comparison result signal (COMP_OUTN) can be output with an abnormal value.

If the change value of the first comparison result signal (COMP_OUTP) or the second comparison result signal (COMP_OUTN) for an LSB (Least Significant Bit) code value has a voltage level of VLSB, then the value of the first comparison result signal (COMP_OUTP) or the second comparison result signal (COMP_OUTN) performs a final control has three levels between the maximum value of VDDQ/2+VOS+VLSB and the minimum value of VDDQ/2-VOS-VLSB.

As described above, a conventional on-die termination circuit in a semiconductor memory apparatus has a problem in that a result value produced by the comparison of a voltage according to a code and a reference voltage is not fixed due to an internal offset voltage and is changed at the start and due to termination timings of an on-die termination operation so that a final on-die termination code value can have an erroneous value. If the code value is continuously changed into an erroneous value, then the impedance of a circuitry using the code value, for example, a driver, is also continuously changed to an erroneous value.

SUMMARY

An apparatus and method for calibrating an on-die termination capable of precisely controlling a code value regardless of an offset voltage and preventing the code value from being changed into an abnormal value in a semiconductor memory apparatus is described herein.

According to one aspect, an on-die termination circuit in a semiconductor memory apparatus can comprise a comparing block for comparing a reference voltage with a code voltage corresponding to a code and outputting a comparison signal, a counting block for changing the code based on the comparison signal, and a controlling block for controlling the counting means based on a match result of previous and current values of the comparison signal.

According to another aspect, a method for calibrating an on-die termination in a semiconductor memory apparatus can comprise the steps of comparing a reference voltage with a code voltage corresponding to a code, to generate a first comparison result, comparing a previous first comparison result with a current first comparison result, to generate a second comparison result, and generating the code by performing a counting operation based on the second comparison result.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
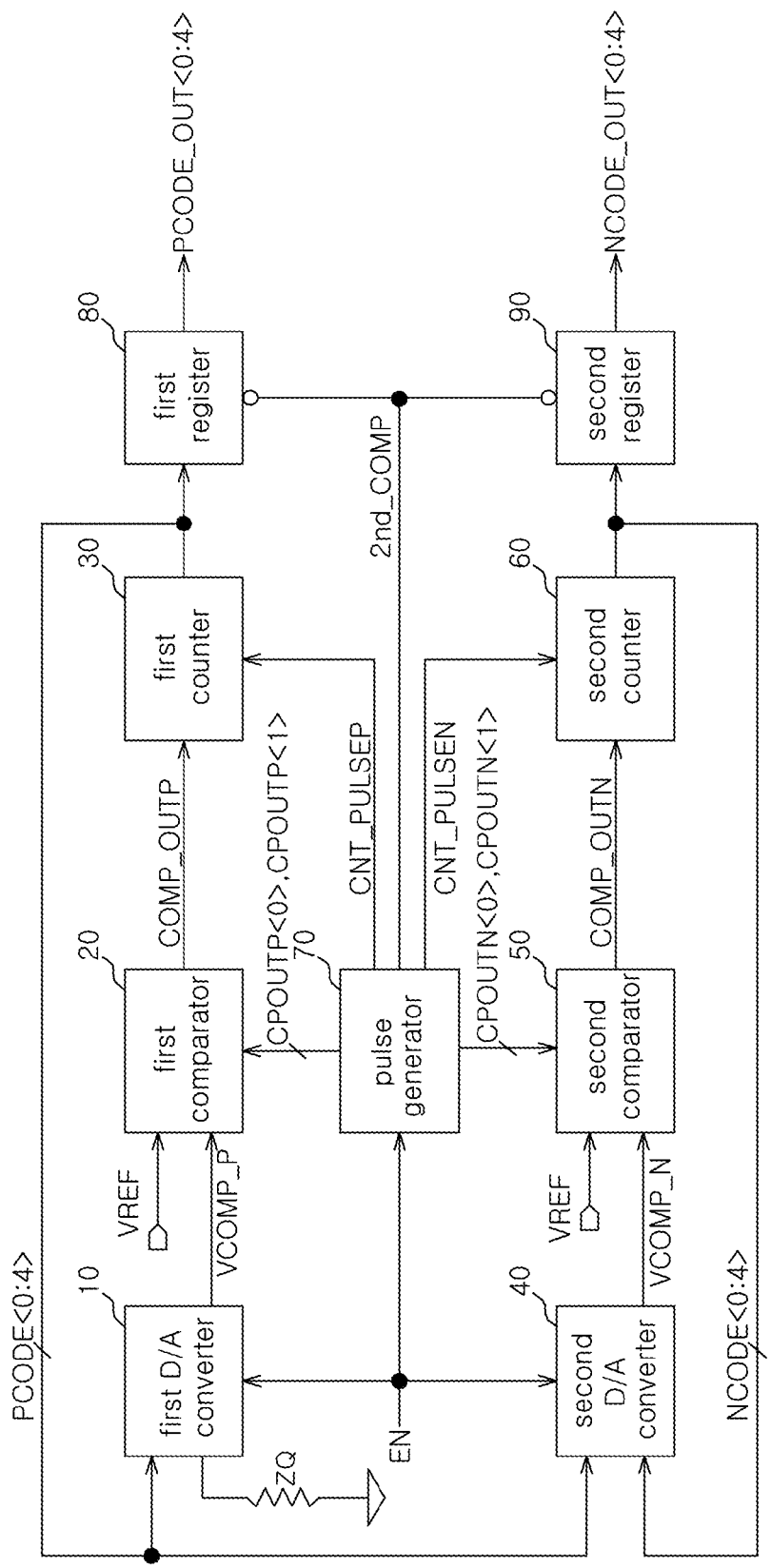
FIG. 1 is a block diagram of an exemplary on-die termination circuit in a semiconductor memory apparatus.
Figure 2:
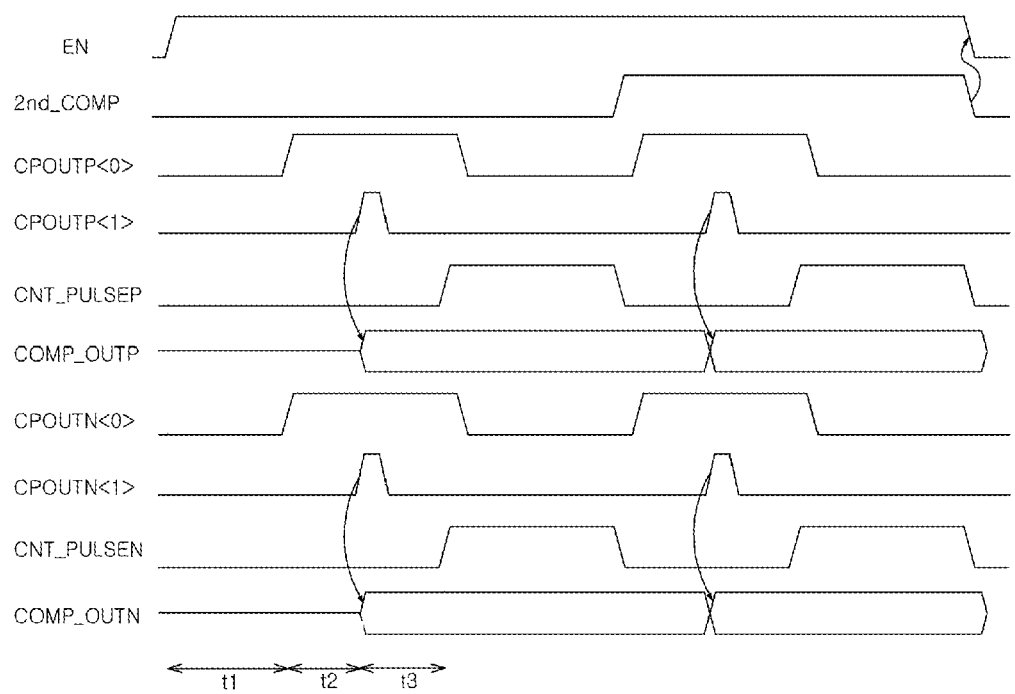
FIG. 2 is an operational timing diagram of the conventional on-die termination circuit that can be included in the circuit illustrated in FIG. 1.
Figure 3:
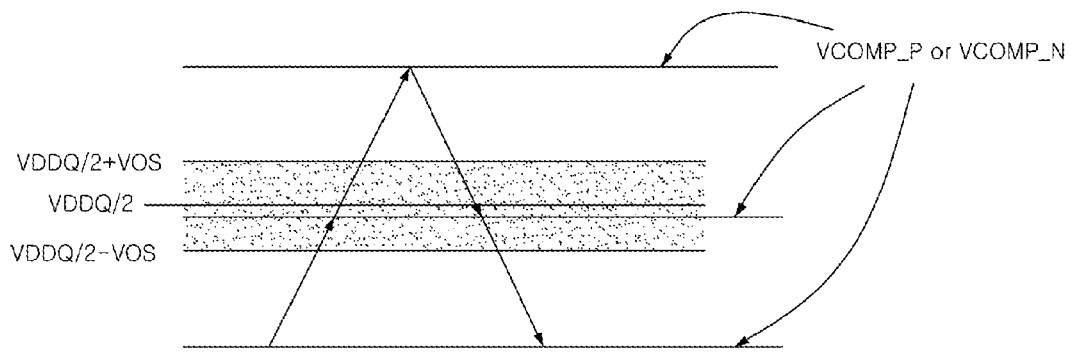
FIG. 3 is a wave form diagram illustrating the occurrence of a code error of the conventional on-die termination circuit that can be included in the circuit illustrated in FIG. 1.
Figure 4:
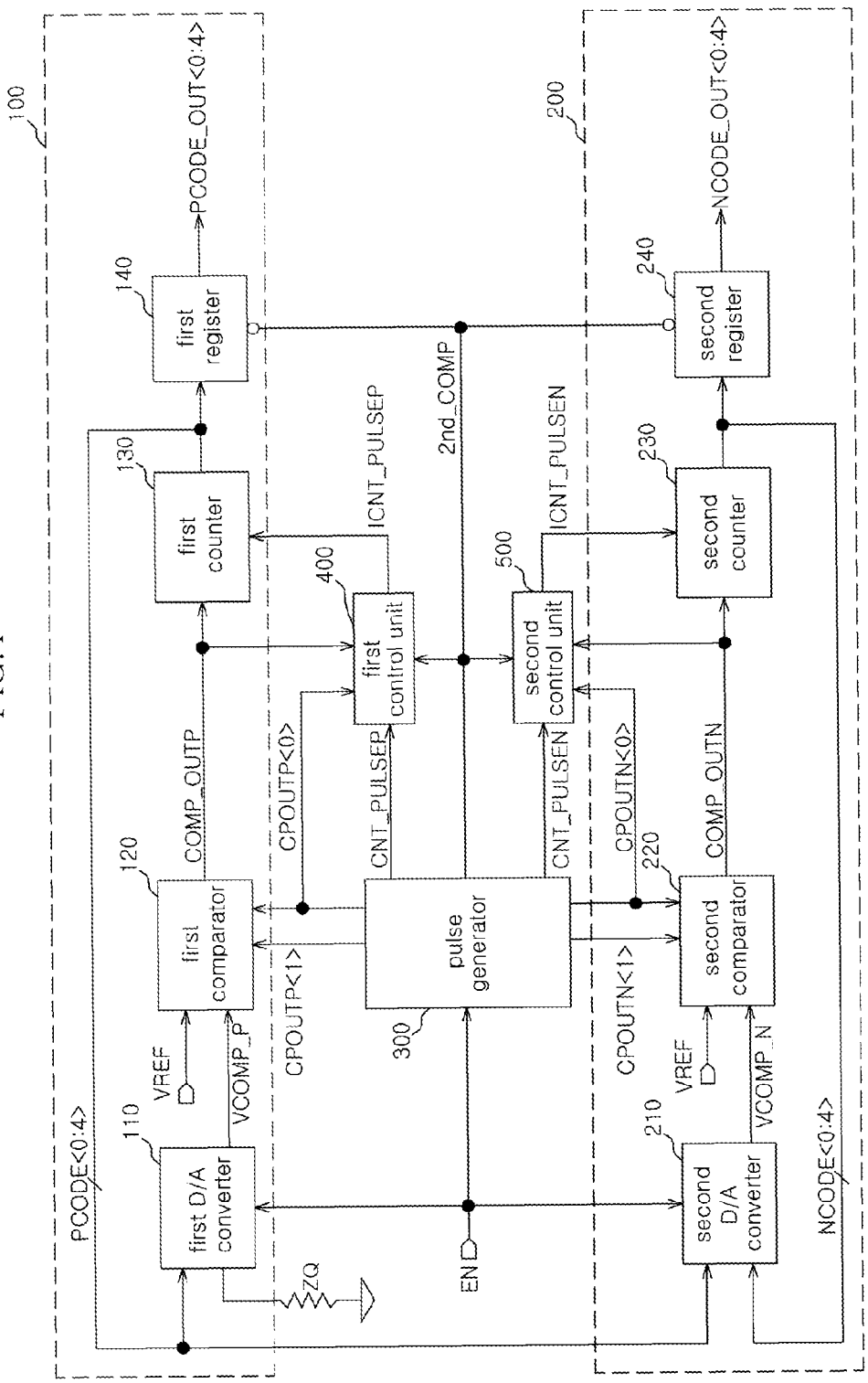
FIG. 4 is a block diagram of an on-die termination circuit in a semiconductor memory apparatus according to one embodiment described herein.

FIG. 4 is a block diagram of an on-die termination circuit in a semiconductor memory apparatus according to one embodiment described herein. As shown in FIG. 4, an on-die termination circuit in a semiconductor memory apparatus can include a first code controlling block 100, a second code controlling block 200, a pulse generating unit 300, a first control unit 400, and a second control unit 500.

The pulse generating unit 300 can receive an enable signal (EN), and can be configured to generate a plurality of pulse signals, for example, a first comparing pulse (CPOUTP<0:1>), a second comparing pulse (CPOUTN<0:1>), a first count pulse (CNT_PULSEP), a second count pulse (CNT_PULSEN) and a code storage pulse (2nd_COMP). The code storage pulse (2nd_COMP) can be used as an initialization pulse to initialize an on-die termination operation.

The first code controlling block 100 can perform a counting operation of a first code (PCODE<0:4>) according to a result produced by the comparison of a first voltage VCOMP_P corresponding to the first code (PCODE<0:4>) and a reference voltage VREF. The first code controlling block 100 can include a first D/A converter 110, a first comparator 120, a first counter 130 and a first register 140.

Figure 5:
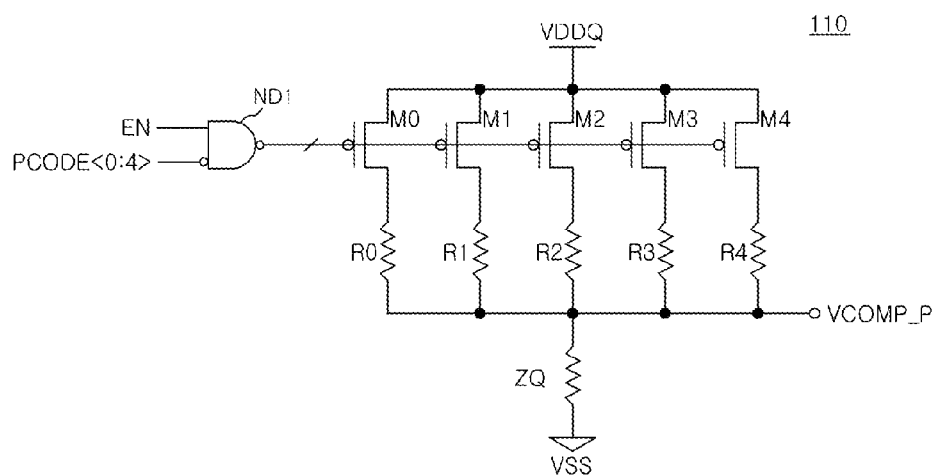
FIG. 5 is a circuit diagram of a first D/A converter that can be included in the circuit illustrated in FIG. 4.

The first D/A converter 110 can convert the first code (PCODE<0:4>) into the first voltage VCOMP_R FIG. 5 is a circuit diagram of a first D/A converter that can be included in the circuit illustrated in FIG. 4. As shown in FIG. 5, the first D/A converter 110 can include a plurality of transistors M0 to M4 of which the sources can be connected to a power source terminal of which the gates can receive the first code (PCODE<0:4>), and a plurality of resistors R0 to R4, which can be connected between the drains of the plurality of the transistors M0 to M4 and an external resistor ZQ. Also, in order to input the first code (PCODE<0:4>) to the gates of the plurality of the transistors M0 to M4 in response to the enable signal EN, a NAND gate ND1 configured to NAND the enable signal (EN) and the first code (PCODE<0:4>), can be included as well as the number of bits of the first code (PCODE<0:4>).

When the first pulse (CPOUTP<0:1>) is inputted to the first comparator 120, the first comparator 120 compares the first voltage VCOMP_P with the reference voltage VREF and then outputs a first comparison result signal (COMP_OUTP). The first comparator 120 can include primary and secondary comparators, which can operate at different timings (CPOUTP<0>) and (CPOUTP<1>). When a first counting control signal (ICNT_PULSEP) is sent to the first counter 130, the first counter 130 can count (up or down) the first code (PCODE<0:4>) based on the first comparison result signal (COMP_OUTP). When the code storage pulse (2nd_COMP) is inputted to the first register 140, the first register 140 can stores the first code (PCODE<0:4>) outputted from the first counter 130. The first register 140 may be an I/O driver using the first code (PCODE<0:4>).

The second code controlling block 200 can count a second code (NCODE<0:4>) according to a result produced by the comparison of a second voltage VCOMP_N corresponding to the second code (NCODE<0:4>) and the reference voltage VREF. The second code controlling block 200 can include a second D/A converter 210, a second comparator 220, a second counter 230 and a second register 240. The second comparator 220, the second counter 230 and the second register 240 can have the same configuration as the first comparator 120, the first counter 130 and the first register 140 of the first code controlling block 100, except the second D/A converter 210.

Figure 6:
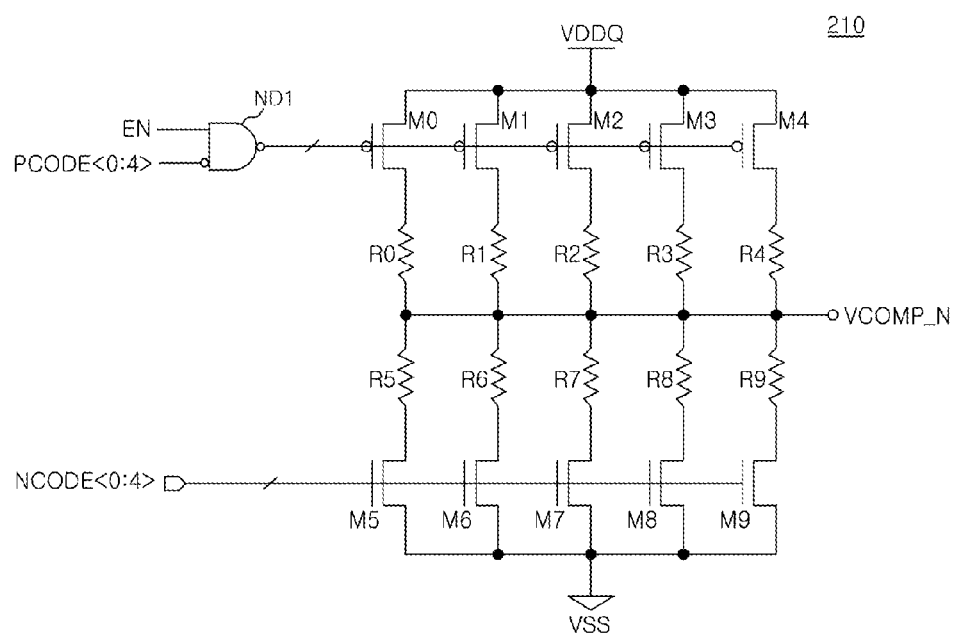
FIG. 6 is a circuit diagram of a second D/A converter that can be included in the circuit illustrated in FIG. 4.

FIG. 6 is a circuit diagram of a second D/A converter that can be included in the circuit illustrated in FIG. 4. Referring to FIG. 6, the second D/A converter 210 can include a plurality of transistors M0 to M4, of which the sources can be connected to a power source terminal, and of which the gates can receive the first code (PCODE<0:4>), a plurality of resistors R0 to R4, which can be respectively connected to the plurality of the transistors M0 to M4, a plurality of resistors R5 to R9, which can be respectively connected to the plurality of the resistors R0 to R4, and a plurality of transistors M5 to M9, which can be respectively connected between the plurality of the resistors R5 to R9 and a ground voltage. In order to input the first code (PCODE<0:4>) to the gates of the plurality of the transistors M0 to M4 in response to the enable signal EN, a NAND gate ND1 for NAND operating the enable signal (EN) and the first code (PCODE<0:4>) can be included as well as the number of bits of the first code (PCODE<0:4>). The second code (NCODE<0:4>) can be inputted to the gates of the plurality of the transistors M5 to M9.

The first control unit 400 can output the first counting control signal (ICNT_PULSEP) to control the counting operation of the first counter 130 based on a match result of the previous and current values of the first comparison result signal (COMP_OUTP).

The second control unit 500 can output a second counting control signal (ICNT_PULSEN) to control the counting operation of the second counter 230 based on a match result of the previous and current values of a second comparison result signal (COMP-OUTN).

Figure 7:
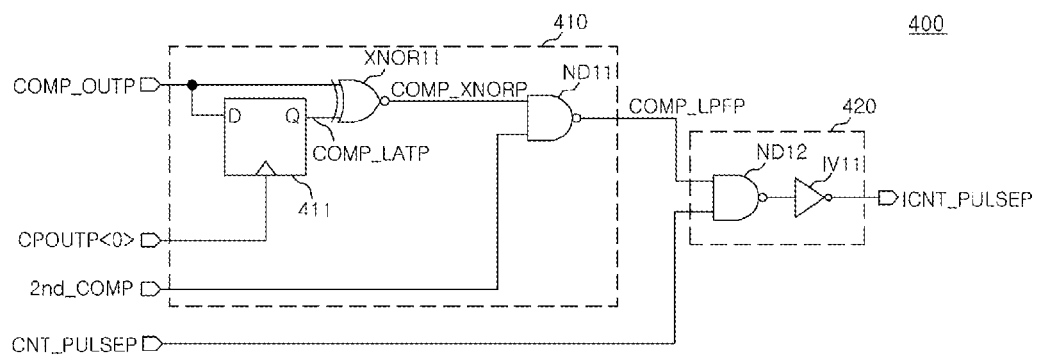
FIG. 7 is a circuit diagram of a first control unit that can be included in the circuit illustrated in FIG. 4.

FIG. 7 is a circuit diagram of a first control unit that can be included in the circuit illustrated in FIG. 4. Referring to FIG. 7, the first control unit 400 may include an error discriminating unit 410 and a counting control signal output unit 420. The error discriminating unit 410 can output an error discriminating signal (COMP_LPFP) based on the match result of the previous and current values of the first comparison result signal (COMP_OUTP). The counting control signal output unit 420 can output the first counting control signal (ICNT_PULSEP) in response to the error discriminating signal (COMP_LPFP).

The error discriminating unit 410 can include a flip-flop 411, which can receive and store the first comparison result signal (COMP_OUTP) when the first pulse (CPOUTP<0>) is inputted to the error discriminating, an XNOR gate XNOR11, which can be configured to receive the first comparison result signal (COMP_OUTP) and an output of the flip-flop 411 and output a high-level signal if the two values are the same, and a NAND gate ND11, which can receive an output of the XNOR gate XNOR11 and the code storage pulse (2nd_COMP) and output the error discriminating signal (COMP_LPFP).

The counting control signal output unit 420 can include a NAND gate ND12, which can perform a NAND operation of the error discriminating signal (COMP_LPFP) and the first count pulse (CNT_PULSEP) and an inverter IV11.

The second control unit 500 can have the same configuration as the first control unit 400.

Figure 8:
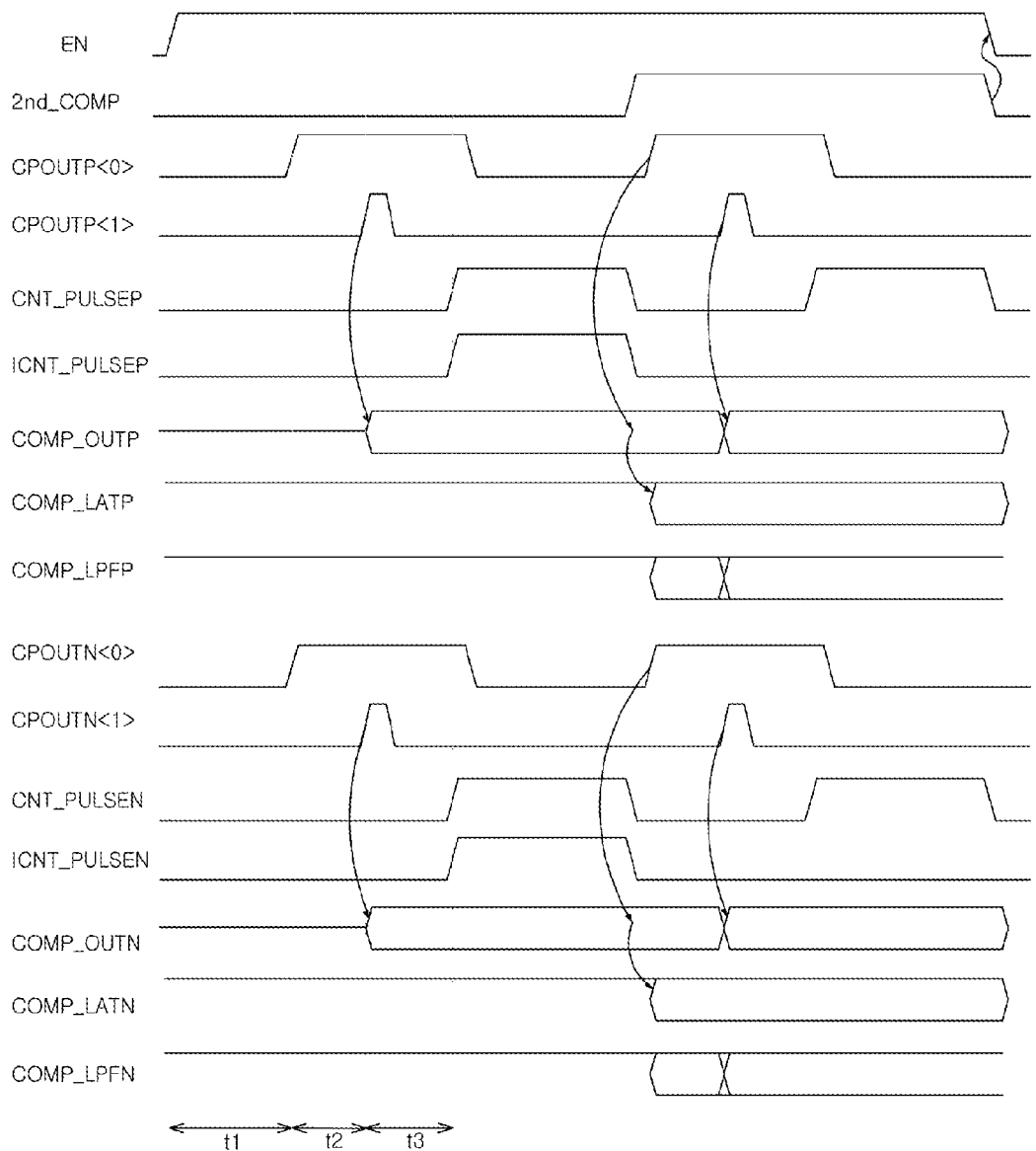
FIG. 8 is an operational timing diagram of the on-die termination circuit according to one embodiment described herein.

FIG. 8 is an operational timing diagram of the on-die termination circuit according to one embodiment described herein. Referring to FIG. 8 the first pulse (CPOUTP<0>) and the second pulse (CPOUTN<0>) are can be generated from the pulse generating unit 300 after a predetermined time of t1 from the activation of the enable signal (EN).

When the enable signal (EN) is inputted to the first D/A converter 110 and the second D/A converter 210, the first D/A converter 110 and the second D/A converter 210 can convert the first code (PCODE<0:4>) and the second code (NCODE<0:4>) into analogue voltages, for example, the first voltage VCOMP_P and the second voltage VCOMP_N, respectively.

The first comparator 120 can compare the first voltage VCOMP_P and with the reference voltage VREF in the first pulse (CPOUT<0>) and the second comparator 220 compare the second voltage VCOMP_N with the reference voltage VREF in response to the second pulse (CPOUTN<0>).

The first pulse (CPOUTP<1>) and the second pulse (CPOUTN<1>) can be generated from the pulse generating unit 300 after a predetermined time of t1+t2. The first comparator 120 and the second comparator 220 can output the first comparison result signal (COMP_OUTP) and the second comparison result signal (COMP-OUTN) in response to the first pulse (CPOUTP<1>) and the second pulse (CPOUTN<1>), respectively.

The first count pulse (CNT_PULSEP) and the second count pulse (CNT_PULSEN) can be generated from the pulse generating unit 300 after a predetermined time of t1+t2+t3.

If the first comparison result signal (COMP_OUTP) and the second comparison result signal (COMP-OUTN), stored in the flip-flop 411 at the time of the previous on-die termination operation, are respectively the same as the first comparison result signal (COMP_OUTP) and the second comparison result signal (COMP-OUTN) according to the current on-die termination operation, then the first control unit 400 and the second control unit 500 can output the error discriminating signal (COMP_LPFP) in a low level. If not, then the first control unit 400 and the second control unit 500 can output the error discriminating signal (COMP_LPFP) in a high level. The first control unit 400 and the second control unit 500 respectively can receive the first comparison result signal (COMP_OUTP) and the second comparison result signal (COMP-OUTN) in response to the first pulse (CPOUTP<1>) and the second pulse (CPOUTN<1>) at the time of the previous on-die termination operation to store them in the flip-flop 411 illustrated in FIG. 7.

If the error discriminating signal (COMP_LPFP) is in a high level, then the counting control signal output unit 420 can output the first count pulse (CNT_PULSEP) and the second count pulse (CNT_PULSEN) as the first counting control signal (ICNT_PULSEP) and the second counting control signal (ICNT_PULSEN) to the first counter 130 and the second counter 230. When the first counting control signal (ICNT_PULSEP) and the second counting control signal (ICNT_PULSEN) are inputted, the first counter 130 and the second counter 230 can produce the first code (PCODE<0:4>) and the second code (NCODE<0:4>) through the up- or down-counting operation.

Meanwhile, if the error discriminating signal (COMP_LPFP) is in a low level, then the counting control signal output unit 420 can output the first counting control signal (ICNT_PULSEP) and the second counting control signal (ICNT_PULSEN) in a low level to block the output of the first count pulse (CNT_PULSEP) and the second count pulse (CNT_PULSEN). Since the first counting control signal (ICNT_PULSEP) and the second counting control signal (ICNT_PULSEN) are outputted in a low level, the first counter 130 and the second counter 230 do not perform a counting operation so that the previous count value is maintained. That is, abnormal code counting due to the offset voltage VOS can be blocked.

The pulse generator 300 can generate the code storage pulse (2nd_COMP) at the start of the second code counting operation, and the code storage pulse (2nd_COMP) is deactivated in a low level at the termination of the second code counting operation.

The first register 140 can store the first code (PCODE<0:4>) outputted from the first counter 130, and the second register 240 stores the second code (NCODE<0:4>) outputted from the second counter 230 according to the deactivation of the code storage pulse (2nd_COMP). Thus, the on-die termination operation has been finished.

If an external command, for example, a refresh command exists, then the actual on-die termination operation can be repetitively performed a predetermined number of times so that the external resistor ZQ and the resistance values of the first D/A converter 110 and the second D/A converter 210 are within a resolution range allowed by the first code (PCODE<0:4>) and the second code (NCODE<0:4>).

Although another on-die termination operation can be newly performed by another refresh command after the on-die termination operation executed by the refresh command has been finished, an original code value can normally be maintained unless an operating environment, such as a temperature or a voltage, abnormally and rapidly changes. In this case, if the on-die termination operation is newly performed, then it is natural that the previous value of the first comparison result signal (COMP_OUTP) is different from the current value of the first comparison result signal (COMP_OUTP).

However, as described above, if the offset voltage VOS exists, then the current value of the first comparison result signal (COMP_OUTP) can be the same as the previous value of the first comparison result signal (COMP_OUTP) whenever the on-die termination operation is newly performed.

When the on-die termination operation is repetitively performed, the logic value of the first comparison result signal (COMP_OUTP) or the second comparison result signal (COMP-OUTN) can be under four situations: 1) low level after high level; 2) two consecutive high levels; 3) two consecutive low levels; and 4) high level after low level.

Figure 9A:
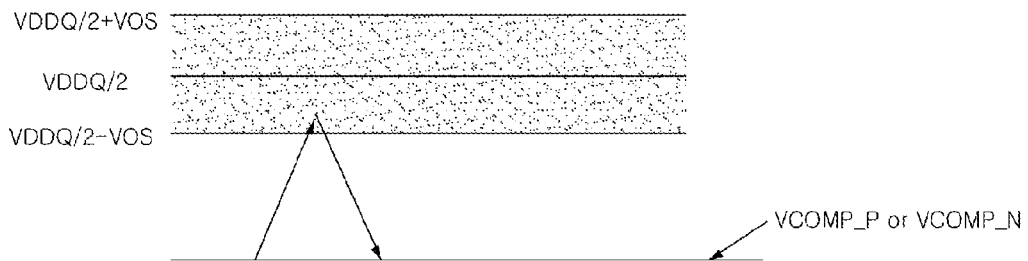
FIGS. 9a to 9c are wave form diagrams illustrating a code processing method of the on-die termination circuit according one embodiment described herein.
Figure 9B:
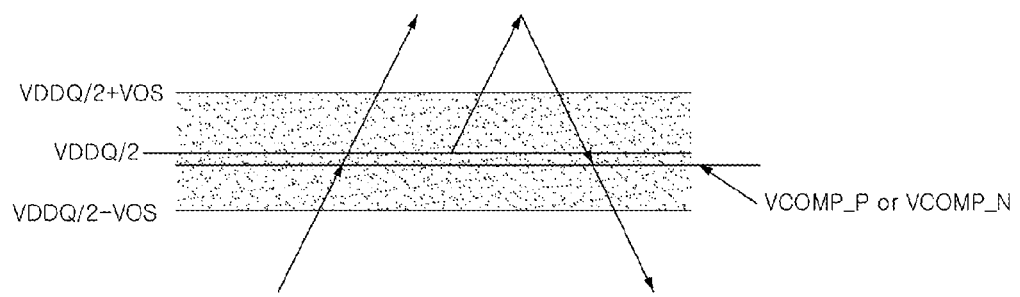
Figure 9C:
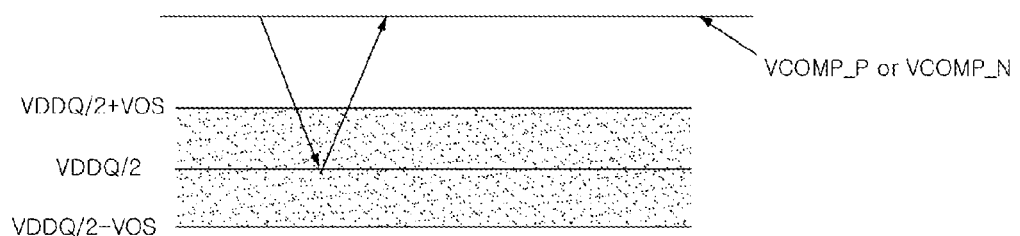

FIGS. 9a to 9c are wave form diagrams illustrating one embodiment of a code processing method of the on-die termination circuit. As shown in FIG. 9a, if the first comparison result signal (COMP_OUTP) or the second comparison result signal (COMP-OUTN) goes from a high level to a low level, then the on-die termination circuit can perform normal code counting. Thus, the first voltage VCOMP_P or the second voltage VCOMP_N can have its original level and the first code (PCODE<0:4>) or the second code (NCODE<0:4>) can have a normal value.

As shown in FIG. 9b, if the first comparison result signal (COMP_OUTP) or the second comparison result signal (COMP-OUTN) is consecutively maintained twice in a high level or in a low level, then the on-die termination may not perform a code counting. Thus, the first voltage VCOMP_P or the second voltage VCOMP_N can maintain its original level and the first code (PCODE<0:4>) or the second code (NCODE<0:4>) is not changed.

As shown in FIG. 9c, if the first comparison result signal (COMP_OUTP) or the second comparison result signal (COMP-OUTN) goes form a low level to a high level, then the on-die termination circuit can perform a normal code counting as illustrated in FIG. 9a. Thus, the first voltage VCOMP_P or the second voltage VCOMP_N can have its original level and the first code (PCODE<0:4>) or the second code (NCODE<0:4>) can have a normal value.

Since the apparatus and method for calibrating an on-die termination in a semiconductor memory apparatus can prevent a code value from being abnormally changed due to the noise component such as an offset voltage, the stability and reliability of the on-die termination circuit can be improved. Also, since the code value is prevented from being abnormally changed, the signal I/O speed of a driver using the code can be improved.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An on-die termination circuit in a semiconductor memory device comprising:
    a comparing block for comparing a reference voltage with a code voltage corresponding to a code and outputting a comparison signal;
    a counting block for changing the code based on a previous value and changing the code in response to a current value of the comparison signal and a counting control signal; and
    a controlling block for generating the counting control signal according to a comparing result between the previous value of the comparison signal with the current value of the comparison signal,
    wherein the code voltage for generating the previous value of the comparison signal is different from the code voltage for generating the current value of the comparison signal.

2. The on-die termination circuit of claim 1, wherein the comparing block includes primary and secondary comparators each of which has different operation timing.

3. The on-die termination circuit of claim 1, wherein the controlling block includes:
    an error discriminating unit for outputting an error discriminating signal based on the comparing result of the previous and current values of the comparison signal; and
    a counting control signal output unit for outputting a counting control signal based on the error discriminating signal.

4. The on-die termination circuit of claim 3, wherein the error discriminating unit includes:
    a storage unit for storing the comparison signal;
    a first logic element for outputting a signal when the comparison signal has a same logic level as an output signal from the storage unit; and
    a second logic element for receiving an output signal of the first logic element and the initial signal and outputting the error discriminating signal.

5. The on-die termination circuit of claim 3, wherein the counting control signal output unit includes a logic circuit for AND operating the error discriminating signal and a counting pulse.

6. The on-die termination circuit of claim 2, further comprising:
    a D/A converting unit for converting an input code into the code voltage;
    a register for storing a code outputted from the counting block;
    a pulse generating unit for generating a plurality of pulse signals to determine operation timings of the comparison block, the counting block, the controlling block and the register.

7. The on-die termination circuit of claim 6, wherein the plurality of pulse signals includes:
    a plurality of comparison pulses provided for the primary and secondary comparators in the comparing block;
    a counting pulse provided for the counting block; and
    an initial pulse provided for the register.

8. The on-die termination circuit of claim 7, wherein one of the plurality of the comparison pulses, the counting pulse and the initial pulse are provided for the controlling block.

* * * * *